(12) United States Patent
Cho et al.

(10) Patent No.: US 8,256,774 B2
(45) Date of Patent: Sep. 4, 2012

(54) CHUCKING MEMBER AND SPIN HEAD AND METHOD FOR CHUCKING SUBSTRATE USING THE CHUCKING MEMBER

(75) Inventors: Jung Keun Cho, Seoul (KR); Kyo-Woog Koo, Cheonan-shi (KR); Bo Ram Chan Sung, Asan-shi (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1385 days.

(21) Appl. No.: 11/896,351

(22) Filed: Aug. 31, 2007

(65) Prior Publication Data

US 2008/0061519 A1 Mar. 13, 2008

(30) Foreign Application Priority Data

Sep. 12, 2006 (KR) .................. 10-2006-0087948

(51) Int. Cl.
*B23B 31/103* (2006.01)
(52) U.S. Cl. .................. 279/106; 118/730
(58) Field of Classification Search .......... 279/35, 279/106–109; 118/730; *B23B 31/103*
See application file for complete search history.

(56) References Cited

U.S. PATENT DOCUMENTS

| | | | |
|---|---|---|---|
| 5,860,181 A | 1/1999 | Maekawa et al. | |
| 6,692,219 B2 | 2/2004 | Coomer et al. | |
| 6,954,585 B2 * | 10/2005 | Mokuo | 392/416 |
| 6,964,419 B2 * | 11/2005 | Jan | 279/106 |
| 7,018,555 B2 * | 3/2006 | Shimbara et al. | 216/92 |
| 7,056,392 B1 | 6/2006 | Kuroki et al. | |
| 7,354,481 B2 * | 4/2008 | Okuno et al. | 118/503 |
| 2004/0237896 A1 | 12/2004 | Hongo | |
| 2005/0023773 A1 * | 2/2005 | Matsuzawa et al. | 279/35 |
| 2007/0283983 A1 * | 12/2007 | Park et al. | 134/21 |
| 2009/0093123 A1 * | 4/2009 | Lee et al. | 438/706 |
| 2009/0108545 A1 * | 4/2009 | Kwon et al. | 279/106 |

FOREIGN PATENT DOCUMENTS

| | | |
|---|---|---|
| JP | 64-075073 | 3/1989 |
| JP | 9-097780 | 4/1997 |
| JP | 3057680 | 6/1999 |
| JP | 2000-100768 | 4/2000 |
| JP | 2000-208591 | 7/2000 |
| JP | 2002-299308 | 10/2002 |
| KR | 10-2005-0049906 | 5/2005 |
| KR | 10-2006-0069027 | * 6/2006 |
| TW | 511136 | 11/2002 |
| TW | 554396 | 9/2003 |

* cited by examiner

*Primary Examiner* — Eric A Gates

(74) *Attorney, Agent, or Firm* — Harness, Dickey & Pierce, P.L.C.

(57) ABSTRACT

A chucking member configured to chuck the edge of a substrate includes a chucking pin which is eccentric from the rotation center. The chucking pin has a streamline shape and includes a first front-end portion disposed at the front end relative to the flow of an air current generated by the rotation of the substrate and a first back-end portion disposed at the back end relative to the flow of the air current. The first front-end portion includes a first tip, and the first front-end portion has a round shape.

11 Claims, 5 Drawing Sheets

CHUCKING MEMBER AND SPIN HEAD AND METHOD FOR CHUCKING SUBSTRATE USING THE CHUCKING MEMBER

CROSS-REFERENCE TO RELATED APPLICATIONS

This U.S. non-provisional patent application claims priority under 35 U.S.C §119 of Korean Patent Application 2006-87948 filed on Sep. 12, 2006, the entirety of which is hereby incorporated by reference.

BACKGROUND

The present invention relates to member and method for chucking a substrate and, more specifically, to a chucking member rotating with a substrate while chucking a edge portion of the substrate and a method for chucking a substrate using the chucking member.

Through a variety of processes, desired patterns are formed on a substrate such as a semiconductor substrate, a glass substrate or liquid crystal panel. In etching and cleaning processes, a wafer spins to remove residues or thin films thereon. While spinning a substrate such as a wafer at thousands of RPM, deionized water (DI water) or etching solution or cleaning solution is supplied. Undoubtedly, the substrate spinning operation has been identically applied to not only a cleaning process but also other semiconductor manufacturing processes such as a photoresist process. Various technical matters concerned with a spin head for spinning a wafer are disclosed in U.S. Pat. No. 5,860,181, to Mackawa et al.

Generally, there are two methods of holding a wafer. One is that the rear surface of a wafer is vacuum-adsorbed to hold the wafer, and the other is that the edge of a wafer is mechanically fixed by means of a support member from the edge of the wafer to hold the wafer. In the latter method, a chucking pin which is eccentric from a rotation shaft rotates to come in contact with the edge of a wafer. While being in contact with the edge of the wafer, a plurality of chucking pins support the wafer. The supported wafer rotates at a high speed and a treating chemical is supplied to a top surface of the rotating wafer.

Unfortunately, conventional chucking pins have disadvantages as follows:

First, a vortex is generated at the rear end of a chucking pin due to the shape of the chucking pin. A rotating wafer causes a vortex to be generated in a direction opposite to the rotation direction of the wafer. That is, when the wafer rotates anticlockwise, a clockwise air current is generated due to the rotation of the wafer. The air current flows outside the wafer while surrounding a circumferential surface of the chucking pin. The air current flowing along the circumferential surface of the chucking pin causes a vortex to be generated at the rear end of the chucking pin. The vortex prevents the air current to smoothly flow outside the wafer.

Second, a cleaning solution supplied to a wafer rear surface and drained to the outside along the wafer rear surface may reflow in the wafer rear surface due to a chucking pin approaching the wafer rear surface while chucking a wafer. Thus, the wafer rear surface may be contaminated.

SUMMARY OF THE INVENTION

Exemplary embodiments of the present invention provide a chucking member rotating with a substrate while chucking the edge of the substrate. In an exemplary embodiment, the chucking member may include: a rotatable body; a chucking pin coupled with the top of the body to be eccentric from the rotation center of the body and configured to chuck the edge of the substrate; and a rotation shaft coupled with the bottom of the body to be rotatable with the body, wherein the chucking pin has a streamline shape.

Exemplary embodiments of the present invention provide a spin head. In an exemplary embodiment, the spin head may include: a rotatable support plate; and chucking members installed on the top surface of the support plate and supporting the edge of the substrate to prevent a substrate loaded on the support plate from separating from the support plate due to the rotation of the substrate, wherein each of the chucking members comprises: a rotatable body; a chucking pin coupled with the top of the body to be eccentric from the rotation center of the body and configured to chuck the edge of the substrate; and a rotation shaft coupled with the bottom of the body to be rotatable with the body, wherein the chucking pin has a streamline shape.

Exemplary embodiment of the present invention provide a method for chucking a substrate using a chucking member with a body and a chucking pin coupled with the top of the body and configured to the edge of the substrate. In an exemplary embodiment, the method may include: rotating the body to allow the chucking pin which is eccentric from the rotation center of the body to come in contact with the edge of the substrate, wherein a first tip of the chucking pin is disposed at a front end relative to the flow of an air current generated by the rotation of the substrate.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

While a wafer W will now be described below as an example of a substrate, the present invention is not limited thereto.

Figure 1:
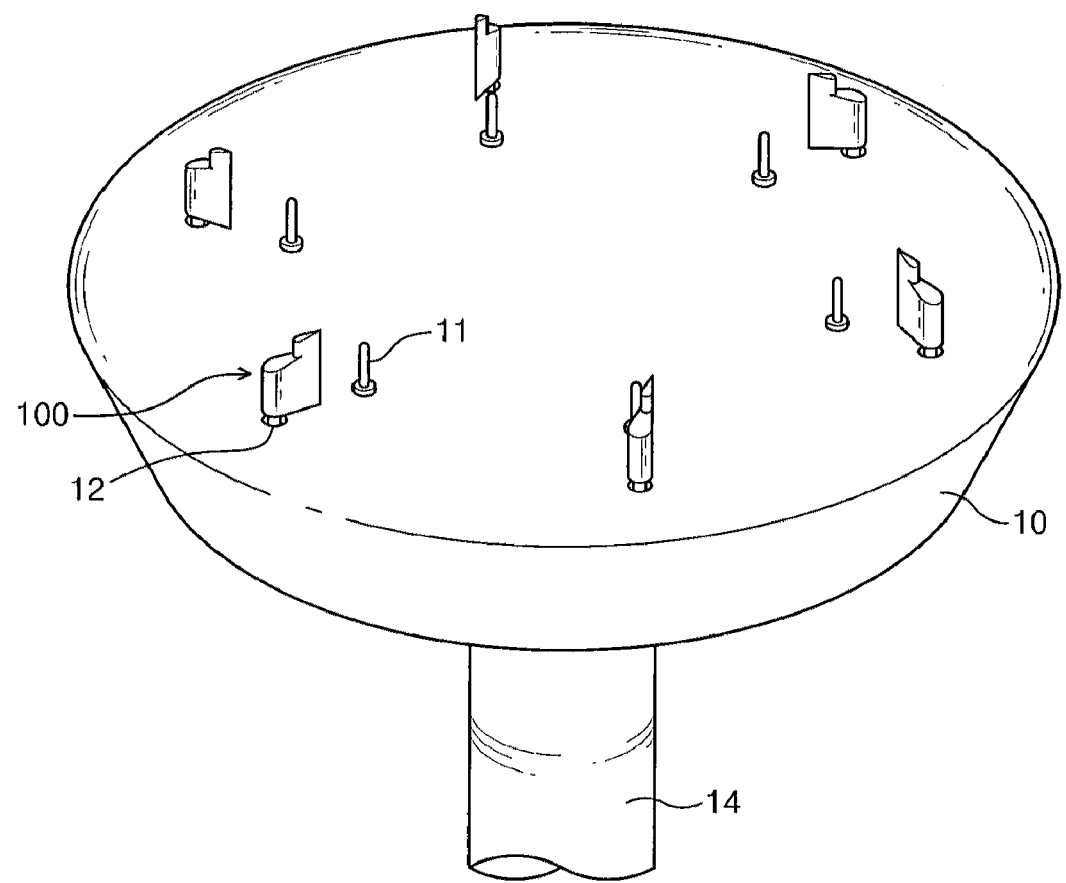
FIG. 1 is a perspective view of a spin head according to the present invention.

FIG. 1 is a perspective view of a spin head 1 according to the present invention. The spin head 1 spins a wafer W while holding the wafer W. The spinning wafer W is to be etched or cleaned by means of a separate etching or cleaning apparatus.

The spin head 1 includes a disk-shaped plate 10 and a plurality of chucking pins 100 disposed on the plate 10 along the edge of the plate 10. The plate 10 has the shape of a disk having the same size as the wafer W. A plurality of through-holes 12 are formed at the top surface of the plate 10 along the edge of the plate 10. A chucking pin 100 is installed on the through-hole 12.

The through-holes 12 are spaced at regular intervals and regular angles θ around the center of the plate 10 such that the chucking pins 100 apply an equivalent force to the wafer W. In this embodiment, six through-holes 12 are formed at the plate 10 and the angle θ between the through-holes 12 is 60 degrees. However, in the case the number of through-holes 12 provided is not six, the angle θ between the through-holes 12 is variable with the number of the through-holes 12 provided.

On the other hand, a rotation shaft 14 is connected to the bottom of the plate 10. The rotation shaft 14 is rotatable by means of a separate driving unit (not shown).

Figure 2:
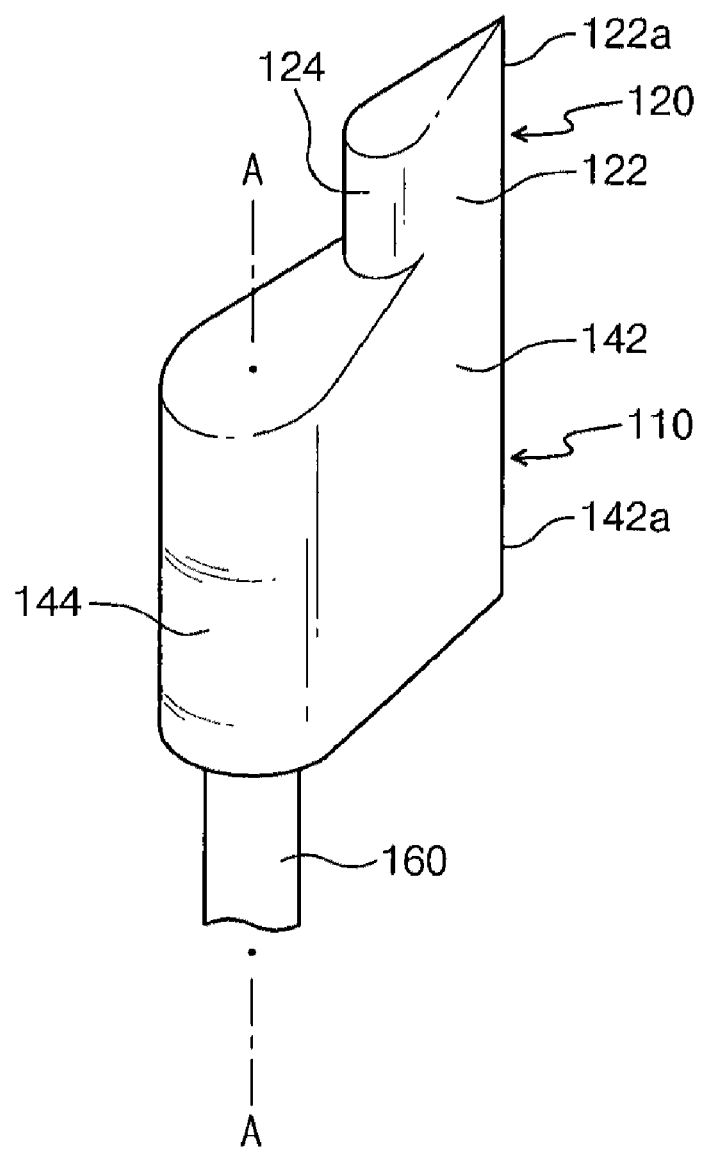
FIG. 2 is a perspective view of a chucking member according to the present invention.

FIG. 2 is a perspective view of a chucking member 100 according to the present invention. The chucking member 100 includes a chucking pin 120, a body 140, and a rotation shaft 160.

The chucking pin 120 supports a wafer W while being in contact with the edge of the wafer W. The chucking pin 120 is disposed to be eccentric from the rotation center A of a rotation shaft 160 which will be described later. Therefore, the chucking pin 120 may come in contact with the edge of the wafer W or may be spaced apart therefrom through its rotation.

As illustrated, the chucking pin 120 includes a first front-end portion 122 disposed at the front end and a first back-end portion 124 disposed at the back end. The first front-end portion 122 has a first tip 122a, which has the shape of a tip. The first back-end portion 124 has a streamline-shaped cross section, which has a round shape. The top surface of the chucking pin 120 is inclined downwardly toward the first back-end portion 124 from the first front-end portion 122. The first front-end portion 122 comes in contact with the edge of the wafer W or is spaced apart therefrom through its rotation, which will be described in detail later.

The body 140 is provided to support the chucking pin 120, and the rotation shaft 160 is connected to the bottom of the body 140. The rotation of the rotation shaft 160 allows the body 140 and the chucking pin 120 to rotate with each other.

As illustrated, the body 140 has a second front-end portion 142 disposed at the front end and a second back-end portion 144 disposed at the back end.

The second front-end portion 142 has a second tip 142a, which has the shape of a tip. The second back-end portion 144 has a streamline-shaped cross section, which has a round shape. The top surface of the body 140 is inclined downwardly toward the second back-end portion 144 from the second front-end portion 142. Since the rotation shaft 160 is connected to the bottom of the second back-end portion 124, the rotation of the rotation shaft 160 allows the second front-end portion 142 to approach a wafer W or to be spaced apart from the wafer W. This will be described in detail later.

The rotation shaft 160 rotates on its rotation center A by means of a separate driving unit (not shown). A wafer W is chucked or unchucked by the rotation of the rotation shaft 160. As described above, the rotation of the rotation shaft 160 allows the first and second front-end portions 122 and 142 to approach the wafer W or to be spaced apart from the wafer W.

Figure 3A:
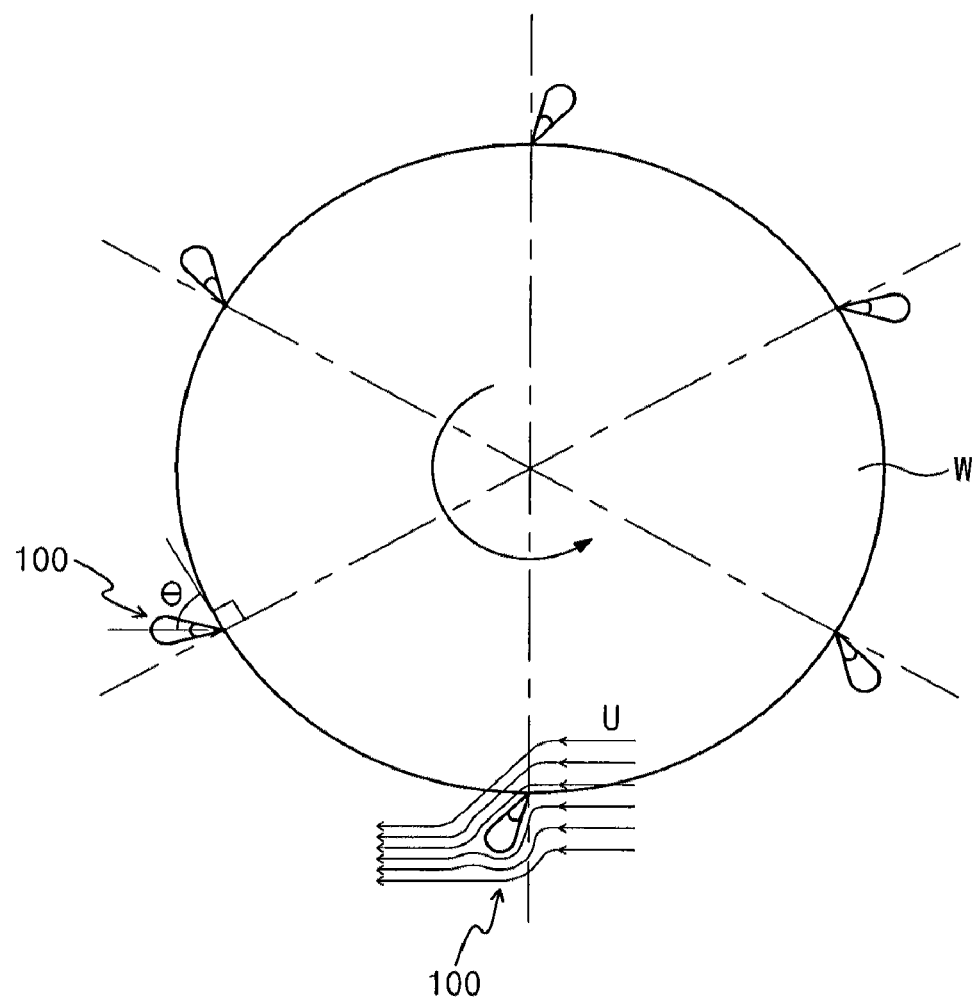
FIGS. 3A and 3B illustrate a chucked wafer.
Figure 3B:
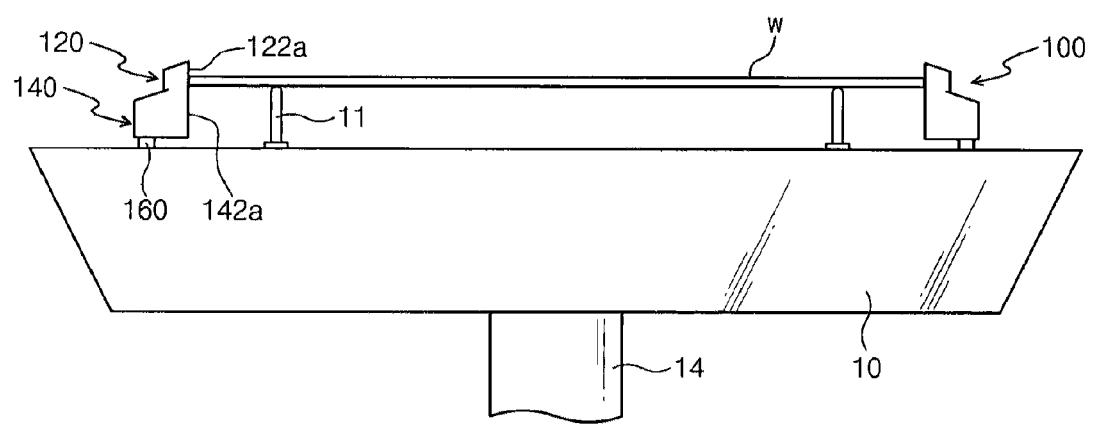
Figure 4A:
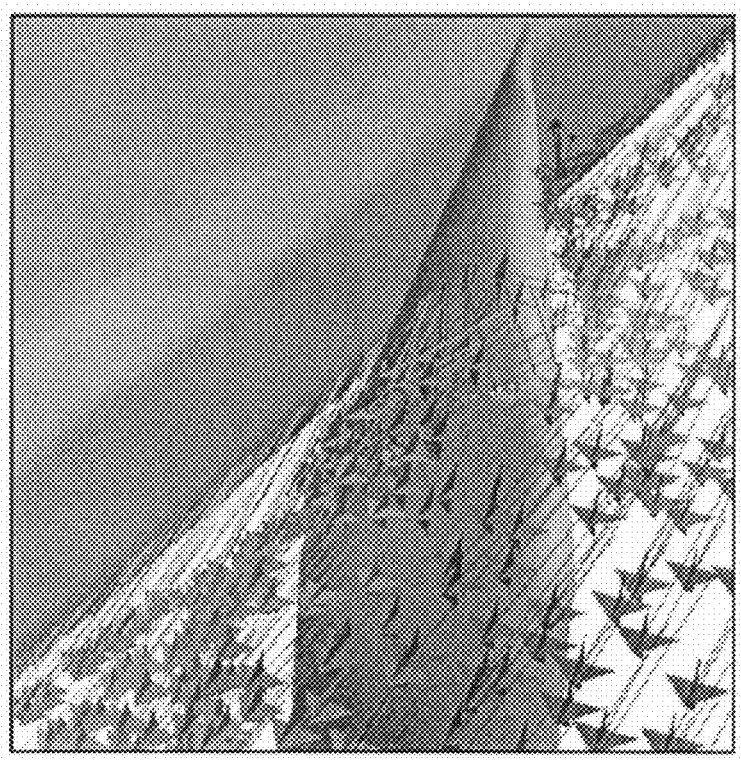
FIGS. 4A and 4B illustrate an air current flowing around a chucking member according to the present invention.
Figure 4B:
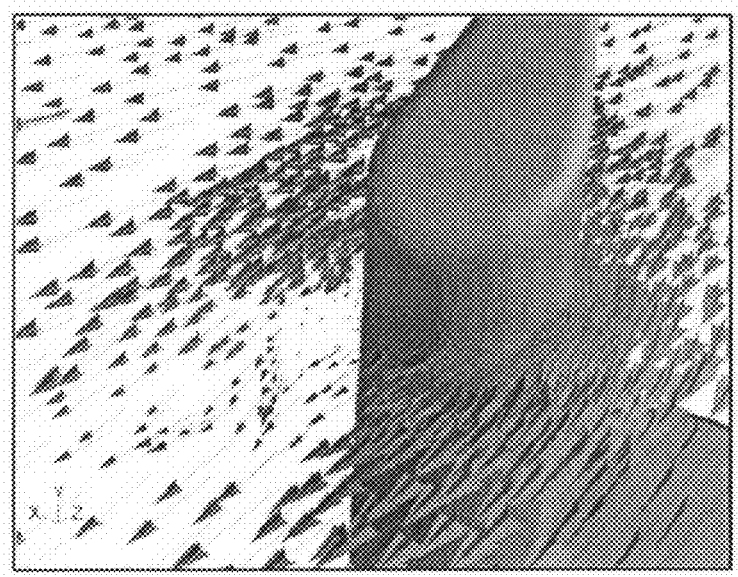

FIGS. 3A and 3B illustrate a chucked wafer W, and FIGS. 4A and 4B illustrate an air current flowing around a chucking member 100 according to the present invention.

As previously stated, if a chucking member 100 rotates on a rotation shaft A, a first front-end portion 122 of a chucking pin 120 comes in contact with the edge of a wafer W and the wafer W is supported by the first front-end portion 122.

If the supported wafer W rotates anticlockwise, an air current U is generated clockwise. As illustrated in FIG. 3A, a generated air current U flows in tangential direction of a wafer W corresponding to a tangential speed of the wafer W. The air current U is exhausted to the outside along the circumferential surface of the chucking pin 120 and the circumferential surface of the body 140.

Relative to the air current U, first and second front-end portions 122 and 142 are disposed at the front end and first and second back-end portions 124 and 144 are disposed at the back end. Thus, the air current U over the wafer W is discharged outside the wafer W through the first back-end portion 124 along a first tip 122a of the first front-end portion 122. On the other hand, the air current under the wafer W is discharged outside the wafer W through the second back-end portion 144 along a second tip 142a of the second front-end portion 142. Since cross sections of the chucking pin 120 and the body 140 are streamline sections, a vortex is not generated at the back end of the first and second back-end portions 124 and 144.

The "streamline" means an object's shape for alleviating the resistance generated when the object moves in a fluid. For example, the body of a fish and the hull and wing of an airplane has the shape of "streamline". A vortex generated at the back of an object is the major factor, which reduces a pressure at the back of the object to generate a drag. Accordingly, the streamline is an appearance for suppressing turbulence at the back of the object. From the type of air current, the principles for streamline are as follows: (1) a front portion of an object should be round enough; and (2) an object should has a curve tapered to the center from the back of the object. As previously described in this embodiment, a tip is formed at the front end and a front end portion is round. However, a tip may be formed at the back end and a front end portion may be round. Moreover, various types of streamline may be applied.

FIG. 4A illustrates an air current U over a wafer W, and FIG. 4B illustrates a current U under the wafer W. As described above, an air current U generated due to the rotation of a wafer W does not generate a vortex at the back end of first and second back-end portions 124 and 144. Thus, the air current U may be discharged smoothly outside the wafer W.

If a tangent line is drawn to a contact point of the wafer W that is in contact with the first front-end portion 122, an angle θ is defined between a straight line running from the rotation center A to the first tip 122a and the tangent line. The angle θ is very significant. That is, the flow of air current U is increasingly blocked with the increase of the angle θ. On the other hand, the flow of air current U becomes smooth with the decrease of the angle θ.

First and second tips 122a and 142a approach the wafer W through their rotation. Since they has the shape of a tip, it may be possible to prevent a treating solution dispersed to the outside of the wafer W from the top or bottom surface of the wafer W from reflowing in the wafer W after colliding against a chucking pin 120 or a body 140.

As illustrated in FIG. 3B, the top surface of the chucking pin 120 is inclined downwardly toward the first back-end portion 124 from the first front-end portion 122. Thus, at the top surface of the chucking pin 120, a portion corresponding to the first front-end portion 122 is disposed to be higher than the top surface of the wafer W while a portion corresponding to the first back-end portion 124 is disposed to be lower than the top surface of the wafer W.

Due to the rotation of a wafer W, a treating solution supplied to the top surface of the wafer W is drained outside the wafer W. However, the treating solution may reflow in the top surface of the wafer W by means of a chucking pin 120 configured to support the wafer W. As described above, the top surface of the chucking pin 120 is inclined to make only a portion of the chucking pin 120 higher than the top surface of the wafer W. Therefore, it may be possible to prevent the treating solution from reflowing in the wafer W.

According to the present invention, an air current generated by the rotation of a substrate is smoothly discharged outside the substrate along circumferential surfaces of a chucking pin and a body which has the shape of a streamline. Moreover, a treating solution drained outside the substrate is prevented from reflowing in a rear surface of the substrate due to a chucking member.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A chucking member rotating with a substrate while chucking an edge of the substrate, the chucking member comprising:
    a rotatable body;
    a chucking pin coupled with a top of the rotatable body to be eccentric from a rotation center of the rotatable body and configured to chuck the edge of the substrate, the chucking pin comprising:
        a first front end portion disposed at a front end relative to a flow of an air current generated by a rotation of the substrate while chucking the substrate and having a first tip; and
        a first back end portion disposed at a back end relative to the flow of the air current, wherein the chucking pin includes a top surface inclined downwardly toward the first back end portion from the first front end portion;
    a rotation shaft coupled with a bottom of the rotatable body to be rotatable with the rotatable body,
    wherein the chucking pin includes a streamline shape, and wherein the rotatable body includes a streamline shape.

2. The chucking member of claim 1, wherein while the chucking pin chucks the edge of the substrate, an acute angle is defined by a tangent line to a contact point of the substrate that is in contact with the chucking pin and a straight line running from the rotation center of the chucking pin to the first tip.

3. The chucking member of claim 1, wherein the rotatable body comprises:
    a second front end portion disposed at the front end relative to the flow of the air current generated by the rotation of the substrate while the chucking pin chucks the substrate and having a second tip; and
    a second back end portion disposed at the back end relative to the flow of the air current and having a round shape.

4. The chucking member of claim 3, wherein the rotatable body has a second top surface inclined downwardly toward the second back end portion from the second front end portion.

5. The chucking member of claim 3, wherein while the chucking pin chucks the edge of the substrate, an acute angle is defined by a tangent line to a contact point of the substrate that is in contact with the chucking pin and a straight line running from the rotation center of the chucking pin to the second tip.

6. A spin head comprising:
    a rotatable support plate; and
    chucking members installed on a top surface of the rotatable support plate and configured to support an edge of a substrate to prevent the substrate loaded on the rotatable support plate from separating from the rotatable support plate due to a rotation of the substrate,
    wherein each of the chucking members comprises:
        a rotatable body;
        a chucking pin coupled with a top of the rotatable body to be eccentric from a rotation center of the rotatable body and configured to chuck the edge of the substrate, the chucking pin comprising:
            a first front end portion disposed at a front end relative to a flow of an air current generated by the rotation of the substrate while chucking the substrate and having a first tip; and
            a first back end portion disposed at a back end relative to the flow of the air current, wherein the chucking pin has a top surface inclined downwardly toward the first back end portion from the first front end portion; and
        a rotation shaft coupled with a bottom of the rotatable body to be rotatable with the rotatable body,
        wherein the chucking pin has a streamline shape, and wherein the rotatable body includes a streamline shape.

7. The spin head of claim 6, wherein while the chucking pin chucks the edge of the substrate, an acute angle is defined by a tangent line to a contact point of the substrate that is in contact with the chucking pin and a straight line running from the rotation center of the chucking pin to the first tip.

8. The spin head of claim 6, wherein the rotatable body comprises:
    a second front end portion disposed at the front end relative to the flow of the air current generated by the rotation of the substrate while the chucking pin chucks the substrate and having a second tip; and
    a second back end portion disposed at the back end relative to the flow of the air current and having a round shape.

9. The spin head of claim 8, wherein while the chucking pin chucks the edge of the substrate, an acute angle is defined by a tangent line to a contact point of the substrate that is in contact with the chucking pin and a straight line running from the rotation center of the chucking pin to the second tip.

10. A chucking member rotating with a substrate while chucking an edge of the substrate, the chucking member comprising:
    a rotatable body, the rotatable body comprising:
        a front end portion disposed at a front end relative to a flow of an air current generated by a rotation of the substrate while the chucking pin chucks the substrate and having a tip; and
        a back end portion disposed at a back end relative to the flow of the air current and having a round shape, wherein the rotatable body has a top surface inclined downwardly toward the back end portion from the front end portion;
    a chucking pin coupled with a top of the rotatable body to be eccentric from a rotation center of the rotatable body and configured to chuck the edge of the substrate;
    a rotation shaft coupled with a bottom of the rotatable body to be rotatable with the rotatable body,
    wherein the chucking pin includes a streamline shape, and wherein the rotatable body includes a streamline shape.

11. The chucking member of claim 10, wherein while the chucking pin chucks the edge of the substrate, an acute angle is defined by a tangent line to a contact point of the substrate that is in contact with the chucking pin and a straight line running from the rotation center of the chucking pin to the tip.

* * * * *